United States Patent
Kelley et al.

(10) Patent No.: US 7,497,967 B2
(45) Date of Patent: Mar. 3, 2009

(54) COMPOSITIONS AND METHODS FOR POLISHING COPPER

(75) Inventors: Francis J. Kelley, Bear, DE (US); John Quanci, Haddonfield, NJ (US); Hongyu Wang, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 407 days.

(21) Appl. No.: 10/809,535

(22) Filed: Mar. 24, 2004

(65) Prior Publication Data

US 2005/0211951 A1    Sep. 29, 2005

(51) Int. Cl.
*C09K 13/00*    (2006.01)
(52) U.S. Cl. ...................... 252/79.1; 438/692
(58) Field of Classification Search ......... 438/689–693; 252/79.1–79.5
See application file for complete search history.

(56) References Cited

U.S. PATENT DOCUMENTS

| | | | | |
|---|---|---|---|---|
| 5,607,718 A * | 3/1997 | Sasaki et al. | ................. | 438/584 |
| 5,897,375 A * | 4/1999 | Watts et al. | ................. | 438/693 |
| 5,972,123 A * | 10/1999 | Verhaverbeke | ................. | 134/3 |
| 5,981,454 A * | 11/1999 | Small | ................. | 510/175 |
| 6,027,554 A * | 2/2000 | Kodama et al. | ................. | 106/3 |
| 6,117,775 A | 9/2000 | Kondo et al. | | |
| 6,276,996 B1 * | 8/2001 | Chopra | ................. | 451/41 |
| 6,326,299 B1 | 12/2001 | Homma et al. | | |
| 6,435,944 B1 * | 8/2002 | Wang et al. | ................. | 451/41 |
| 6,509,270 B1 * | 1/2003 | Held | ................. | 438/691 |
| 6,562,719 B2 | 5/2003 | Kondo et al. | | |
| 6,569,216 B1 * | 5/2003 | Taira et al. | ................. | 51/309 |
| 6,585,568 B2 | 7/2003 | Tsuchiya et al. | | |
| 6,605,537 B2 | 8/2003 | Bian et al. | | |
| 6,620,037 B2 | 9/2003 | Kaufman et al. | | |
| 6,632,259 B2 | 10/2003 | Weinstein et al. | | |
| 2003/0181345 A1 | 9/2003 | Bian | | |
| 2003/0219982 A1 | 11/2003 | Kurata et al. | | |
| 2004/0023492 A1 | 2/2004 | Bian et al. | | |
| 2004/0065022 A1 * | 4/2004 | Machii et al. | ................. | 51/309 |
| 2005/0031789 A1 * | 2/2005 | Liu et al. | ................. | 427/340 |
| 2005/0104048 A1 * | 5/2005 | Thomas et al. | ................. | 252/515 |
| 2005/0136671 A1 * | 6/2005 | Goldberg et al. | ............. | 438/691 |

FOREIGN PATENT DOCUMENTS

| | | |
|---|---|---|
| EP | 1 211 717 A1 | 6/2002 |
| EP | 1 223 609 A1 | 7/2002 |
| WO | WO 99/64527 A1 | 12/1999 |
| WO | WO 01/14496 A1 | 3/2001 |
| WO | WO 02/094957 A2 | 11/2002 |

OTHER PUBLICATIONS

Richard J. Lewis, Sr. "Haeley's condensed Chemical Dictionary", thirteenth edition, 1997, p. 1066.*
Grant et al. "Chemical Dictionary", fifth edition, 1987, p. 121.*
Merriam-Webster's Collegiate Dictionary, 1997, tenth edition, p. 1107.*

* cited by examiner

*Primary Examiner*—Kin-Chan Chen
(74) *Attorney, Agent, or Firm*—Blake T. Biederman

(57) ABSTRACT

The present invention provides an aqueous composition useful for polishing copper interconnects on a semiconductor wafer comprising by weight percent up to 25 oxidizer, 0.05 to 1 inhibitor for a nonferrous metal, 0.01 to 5 complexing agent for the nonferrous metal, 0.01 to 5 modified cellulose, and balance water, wherein the composition is free of polyacrylic acid, the amount of modified cellulose providing a copper removal function and a wafer clear of copper.

2 Claims, No Drawings

000
COMPOSITIONS AND METHODS FOR POLISHING COPPER

BACKGROUND OF THE INVENTION

The invention relates to chemical mechanical planarization (CMP) of semiconductor wafer materials and, more particularly, to CMP compositions and methods for polishing copper interconnects from semiconductor wafers in the presence of dielectrics and barrier materials.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a first step removes excess interconnect metals, such as copper at an initial high rate. After the first step removal, a second step polishing can remove remaining metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration. What is needed is a method to reduce dishing of metal in trenches or troughs without lengthening the duration of the polishing operation. Polishing compositions that leave a surface clear of interconnect metal residue after a short second step polishing time are needed.

U.S. patent application Ser. No. 2003/0219982 A1 mentions in a general way that cellulose might be used as a protective film forming agent or a water soluble polymer in polishing compositions for use on metals. Specific concentrations and cellulose properties are not disclosed in this reference. There is a need for polishing compositions that provide low dishing while providing adequate metal residue clearing.

STATEMENT OF THE INVENTION

In a first aspect, the present invention provides an aqueous composition useful for polishing for a copper clearing step on a semiconductor wafer comprising by weight percent up to 25 oxidizer, 0.05 to 1 inhibitor for a nonferrous metal, 0.01 to 5 complexing agent for the nonferrous metal, 0.01 to 5 modified cellulose, and balance water, the amount of modified cellulose providing a copper removal function and a wafer clear of copper residue.

In a second aspect, the present invention provides a method for polishing for a copper clearing step on a semiconductor wafer comprising, contacting the wafer with a polishing composition, the wafer containing the copper, the polishing composition comprising by weight percent up to 25 oxidizer, 0.05 to 1 inhibitor for a nonferrous metal, 0.01 to 5 complexing agent for the nonferrous metal, 0.01 to 5 modified cellulose, and balance water, and polishing the wafer with a polishing pad, the amount of modified cellulose providing a copper removal function and a wafer clear of copper residue.

In a third aspect, the present invention provides a method for polishing for a copper clearing step on a semiconductor wafer in which carboxy methyl cellulose (CMC) used in the polishing composition has a degree of substitution (DS) of 0.1 to 3.0 and a molecular weight (MW) of 20K to 1000K.

DETAILED DESCRIPTION

The composition and method provide unexpected copper removal and clearing of copper residue present when polishing copper interconnects. The composition of the present invention utilizes amounts of water soluble cellulose modified with carboxylic acid functionality that, without other water soluble polymers in the composition, provide a wafer clear of copper residue, advantageously at a reduced polishing time for copper polishing. Although the present invention has particular usefulness in copper interconnects, the present aqueous polishing composition also provides enhanced polishing of other nonferrous metal interconnects, such as aluminum, gold, nickel, platinum group metals, silver, tungsten, and alleys thereof.

The polishing composition of this invention contains 0.01 to 5.0 weight percent of water soluble cellulose modified with carboxylic acid functionality. Preferably, the composition contains about 0.3 weight percent of water soluble cellulose. Exemplary modified cellulose are anionic gums such as agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their modifications and combinations. The preferred water soluble cellulose, carboxy methyl cellulose (CMC), has a degree of substitution of 0.1 to 3.0 with a molecular weight of 20K to 1000K. More preferred CMC has a degree of substitution of 0.7 to 1.2 with a molecular weight of 40K to 250K. Degree of substitution in CMC is the number of hydroxyl groups on each anhydroglucose unit in the cellulose molecule that is substituted. It can be considered as a measure of the "density" of carboxylic acid groups in the CMC.

Advantageously, the solution contains up to 25 weight percent oxidizer. More preferably, the oxidizer is in the range of 5 to 10 weight percent. The oxidizer is particularly effective at assisting the solution in removing copper at low pH ranges. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Furthermore, it is often advantageous to use a mixture of oxidizer compounds. When the polishing shiny contains an unstable oxidizing agent such as, hydrogen peroxide, it is often most advantageous to mix the oxidizer into the composition at the point of use.

Further, the solution contains 0.05 to 1.0 weight percent inhibitor to control copper interconnect removal rate by static etch or other removal mechanism. Adjusting the concentration of an inhibitor adjusts the interconnect metal removal rate by protecting the metal from static etch. Advantageously, the solution contains 0.2 to 1.0 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole and imidazole. BTA is a particularly effective inhibitor for copper and silver.

In addition to the inhibitor, the composition advantageously contains 0.01 to 3 weight percent complexing agent for the nonferrous metal. The complexing agent, prevents precipitation of the metal ions formed by dissolving the nonferrous metal interconnects. Advantageously, the composition contains 0.1 to 1 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Advantageously, the complexing agent is selected from the group consisting of acetic acid, citric acid, ethyl acetoacetate, glycolic acid, lactic acid, malic acid, oxalic acid and mixtures thereof. Most advantageously, the complexing agent is malic acid.

The compounds provide efficacy over a broad pH range in solutions containing a balance of water. This solution's useful pH range extends from at least 2 to 5. In addition, the solution advantageously relies upon a balance of deionized water to limit incidental impurities. The pH of the polishing fluid of this invention is preferably from 2.5 to 4.2, more preferably a pH of 2.6 to 3.8. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Further, the polishing composition may optionally contain 0.01 to 10 weight percent abrasive to facilitate metal layer removal. Within this range, it is desirable to have the abrasive present in an amount of less than or equal to 1 weight percent. Most preferably, the polishing compositions of the present invention are abrasive free.

The abrasive has an average particle size of less than or equal to 100 nanometers (nm) for preventing excessive metal dishing, dielectric erosion and improving planarization. For purposes of this specification, particle size refers to the average particle size of the abrasive. More preferably, it is desirable to use a colloidal abrasive having an average particle size of less than or equal to 70 nm. Further, minimal dielectric erosion and metal dishing advantageously occurs with colloidal silica having an average particle size of less than or equal to 40 nm. In addition, the preferred colloidal abrasive may include additives, such as dispersants, surfactants, buffers, and biocides to improve the stability of the colloidal abrasive. One such colloidal abrasive is colloidal silica from Clariant S. A., of Puteaux, France. Also, other abrasives, including, those that are fumed, precipitated, agglomerated, etc., may be utilized.

The polishing composition may include the abrasive for "mechanical" removal of metal interconnect layers. Example abrasives include inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles, coated polymeric particles, and surfactant stabilized particles. The preferred abrasive, if utilized, is silica.

The composition of the present invention is applicable to any semiconductor wafer containing a conductive metal, such as copper, aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The composition and method are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The compositions of this invention may also be used for ECMP (Electrochemical Mechanical Polishing).

EXAMPLE 1

In the Example, 1 represents the example of the invention and A represents a comparative example. The comparative example composition (A) contained, by weight percent, 0.30 BTA, 0.22 malic acid, 0.15 carboxymethyl cellulose (CMC), a blend of 0.09 polyacrylic acid (30 k)/0.09 polyacrylic acid (250 k) and 9.00 hydrogen peroxide at a pH of 3.1. The composition of this invention (1) contained, by weight percent, 0.50 BTA, 0.22 malic acid, 0.32 carboxymethylcellulose (CMC), and 9.00 hydrogen peroxide at a pH of 2.8.

The experiment measured polishing rates for copper polishing including the clearing of residual copper from a semiconductor wafer at high down force pressures. In particular, the test determined the effect of the utilization of modified cellulose compounds in the absence of polyacids, such as polyacrylic acid, on the polishing rate and residual copper clearing. An Applied Materials, Inc. Mirra 200 mm polishing machine using an IC1010™ polyurethane polishing pad (Rohm and Haas Electronic Materials, CMP Technologies) under downforce conditions of about 3 psi (20.7 kPa) and a polishing solution flow rate of 80 cc/min, a platen speed of 33 RPM and a carrier speed of 61 RPM planarized the samples. The polishing solutions had a pH adjusted with nitric acid. All solutions contained deionized water.

TABLE 1

| Test | CMC (Wt. %) | Polishing Time (s) | Residue Clearing | Polyacrylic Acid (Wt. %) | Removal rate (A/min) | Dishing (A) (9/1 90%) |
| --- | --- | --- | --- | --- | --- | --- |
| A | 0.15 | 181 | No | 0.18 | 1315 | 820 |
| 1 | 0.32 | 148 | Yes | 0 | 1488 | 438 |

As illustrated in Table 1, the addition of CMC in an amount of 0.32 weight percent without polyacrylic acid provides a satisfactory higher copper removal rate, a reduction in processing time for clearing step copper polishing, and a planarized semiconductor wafer clear of residual copper with lower dishing.

EXAMPLE 2

The compositions used in this example are the same as Composition 1 used in Example 1. Properties of the CMC, degree of substitution, DS, and molecular weight, MW, were varied in the compositions from a DS of 0.7 to 1.2 and MW of 45K to 700K. The polishing conditions enumerated in Example 1 were used for the tests of Example 2. The polishing time for each test was to end point 1 (that time where a break in the copper over barrier was detected) plus 70 seconds. CMC properties and dishing results are shown on Table 2 below:

TABLE 2

| Test | CMC Wt. % | CMC DS | CMC MW | RR A/min | Dishing A, 100 μm | Residue Clearing |
|---|---|---|---|---|---|---|
| 2 | 0.32 | 0.7 | 60K | 1488 | 650 | Yes |
| 3 | 0.32 | 0.7 | 80K | 1416 | NA | Yes |
| 4 | 0.32 | 0.7 | 45K | 1606 | 428 | Yes |
| 5 | 0.32 | 0.9 | 250K | 1642 | 885 | Yes |
| 6 | 0.32 | 0.9 | 700K | 1197 | 1635 | Yes |
| 7 | 0.32 | 1.2 | 250K | 1255 | 1093 | Yes |

The data in Table 2 show that CMC at 0.32 weight percent and a DS from 0.7 to 1.2 provides residue clearing. However, dishing may be excessive when the molecular weight of the CMC is above about 250K.

The invention claimed is:

1. An aqueous composition useful for polishing and removing copper on a semiconductor wafer comprising by weight percent up to 25 oxidizer, 0.05 to 1 inhibitor for a nonferrous metal, 0.01 to 5 complexing agent for the nonferrous metal, 0.01 to 5 modified cellulose, the modified cellulose being carboxy methyl cellulose having a degree of substitution of 0.1 to 3.0 and a molecular weight of 20K to 1000K, and balance water at a pH of 2 to 5, wherein said composition is abrasive free and free of polyacrylic acids.

2. The composition of claim 1 wherein the carboxy methyl cellulose has a degree of substitution of 0.7 to 1.2 and a molecular weight of 40K to 250K.

* * * * *